(12) United States Patent
Thon et al.

(10) Patent No.: US 11,893,149 B2
(45) Date of Patent: Feb. 6, 2024

(54) FLEXIBLE TRANSPARENT MEMBRANE LIGHT EMITTING DIODE ARRAY AND SYSTEMS CONTAINING THE SAME

(71) Applicant: THE JOHNS HOPKINS UNIVERSITY, Baltimore, MD (US)

(72) Inventors: Susanna Thon, Baltimore, MD (US); Charbel Rizk, Baltimore, MD (US); Botong Qiu, Baltimore, MD (US)

(73) Assignee: THE JOHNS HOPKINS UNIVERSITY, Baltimore, MD (US)

( * ) Notice: Subject to any disclaimer, the term of this patent is extended or adjusted under 35 U.S.C. 154(b) by 200 days.

(21) Appl. No.: 17/600,052

(22) PCT Filed: Apr. 1, 2020

(86) PCT No.: PCT/US2020/026272
§ 371 (c)(1),
(2) Date: Sep. 29, 2021

(87) PCT Pub. No.: WO2020/206044
PCT Pub. Date: Oct. 8, 2020

(65) Prior Publication Data
US 2022/0187904 A1 Jun. 16, 2022

Related U.S. Application Data

(60) Provisional application No. 62/828,707, filed on Apr. 3, 2019.

(51) Int. Cl.
*G06F 3/01* (2006.01)
*H01L 51/50* (2006.01)
(Continued)

(52) U.S. Cl.
CPC ............. *G06F 3/011* (2013.01); *C09K 11/02* (2013.01); *C09K 11/565* (2013.01);
(Continued)

(58) Field of Classification Search
CPC .......... B82Y 30/00; B82Y 15/00; G02C 7/00; G02B 1/00; G02B 27/01; A41D 31/04;
(Continued)

(56) References Cited

U.S. PATENT DOCUMENTS 7,602,301 B1 * 10/2009 Stirling ................ A61B 5/6804
340/573.7
7,910,400 B2 * 3/2011 Kwon .................. H10K 50/115
257/E21.007

(Continued)

OTHER PUBLICATIONS

Zaryanov, N. (Ru Authorized Officer), International Search Report and Written Opinion dated Jul. 16, 2020 in corresponding International Application No. PCT/US2020/026272, 9 pages.

*Primary Examiner* — John R Lee
(74) *Attorney, Agent, or Firm* — MH2 TECHNOLOGY LAW GROUP LLP (57) ABSTRACT

Provided are systems, compositions and methods that useful in any setting where generating and tracking light is used. The systems, methods and compositions contain as a component flexible, transparent membrane-based materials that include light emitting diodes (LEDs). The LEDs can include or be formed from colloidal quantum dots (CQDs) as an active layer. The CQDs can be formed from solution-processed semiconductor nanocrystals. They have a tunable band gap energy that can be readily tuned by adjusting the size of the nanocrystals. Transparent membrane-based LED arrays exhibit emission wavelength that can be tuned anywhere in the range of 800-2000 nm. The LEDs are highly transparent in the visible wavelength range with the exception of the CQD active layer. The CQD-based LEDs are components of any device or system wherein generating and/or tracking reflected light is utilized, such as in tracing the location and movement of a living individual, or an inanimate object. Also provided are garments used in move- (Continued)

ment tracking, and imaging devices, which include cameras and microscopes, and systems for volume capture, body motion tracking, eye tracking systems and devices, motion capture systems, simulcam technologies, computer generated characters, holograms, eye wear, such as glasses, goggles, and virtual reality headsets, and medical devices that involve imaging, such as devices that involve imaging of the eye for diagnosing and/or treating eye disorders.

25 Claims, 4 Drawing Sheets

(51) Int. Cl.
| | |
|---|---|
| *H01L 51/00* | (2006.01) |
| *H01L 27/32* | (2006.01) |
| *C09K 11/02* | (2006.01) |
| *C09K 11/66* | (2006.01) |
| *C09K 11/56* | (2006.01) |
| *H10K 50/115* | (2023.01) |
| *H10K 59/60* | (2023.01) |
| *H10K 77/10* | (2023.01) |
| *H10K 85/10* | (2023.01) |
| *H10K 102/00* | (2023.01) |

(52) U.S. Cl.
CPC ............ *C09K 11/668* (2013.01); *G06F 3/013* (2013.01); *H10K 50/115* (2023.02); *H10K 59/60* (2023.02); *H10K 77/111* (2023.02); *H10K 85/1135* (2023.02); *H10K 85/146* (2023.02); *H10K 2102/351* (2023.02)

(58) Field of Classification Search
CPC .... F21K 9/00; G09F 3/00; G09G 3/14; H01L 29/861; G09K 11/668; G09K 11/565; G09K 11/02; H10K 85/146; H10K 85/1135; H10K 2102/351; H10K 59/60; H10K 77/10; H10K 77/11; H10K 50/115; G02F 3/014; G02F 3/012; G06F 3/013; G06F 3/011

See application file for complete search history.

(56) References Cited

U.S. PATENT DOCUMENTS

| | | | | |
|---|---|---|---|---|
| 8,563,143 | B2* | 10/2013 | Park | H10K 50/166 |
| | | | | 428/917 |
| 9,370,302 | B2* | 6/2016 | Krueger | A61B 3/113 |
| 9,793,505 | B2 | 10/2017 | Zhou et al. | |
| 10,164,205 | B2* | 12/2018 | Kazlas | H10K 50/14 |
| 10,276,820 | B2* | 4/2019 | Ju | H10K 50/17 |
| 10,535,829 | B1* | 1/2020 | Kim | H10K 50/115 |
| 10,684,478 | B2* | 6/2020 | Osterhout | G06F 3/03545 |
| 10,908,422 | B2* | 2/2021 | Border | G06F 3/011 |
| 10,944,069 | B2* | 3/2021 | Seo | G09G 3/3258 |
| 11,005,058 | B2* | 5/2021 | Zhou | B82Y 20/00 |
| 11,184,967 | B2* | 11/2021 | Coleman | H05B 47/11 |
| 11,302,883 | B2* | 4/2022 | Rahmati | H01L 33/06 |
| 11,374,190 | B2* | 6/2022 | Jiang | H10K 50/15 |
| 11,469,388 | B2* | 10/2022 | Li | H10K 50/115 |
| 11,569,467 | B2* | 1/2023 | Jung | C09K 11/025 |
| 11,667,834 | B2* | 6/2023 | Lee | H10K 71/15 |
| | | | | 438/29 |
| 2009/0001385 | A1* | 1/2009 | Skipor | H01L 33/14 |
| | | | | 257/79 |
| 2009/0039764 | A1* | 2/2009 | Cho | H10K 50/115 |
| | | | | 313/504 |
| 2009/0278141 | A1* | 11/2009 | Coe-Sullivan | H01L 27/156 |
| | | | | 257/89 |
| 2014/0027713 | A1* | 1/2014 | Cox | H01L 33/0087 |
| | | | | 438/47 |
| 2018/0233688 | A1* | 8/2018 | Chen | H10K 50/81 |
| 2021/0408761 | A1* | 12/2021 | Scheller | H01S 5/0657 |
| 2022/0187904 | A1* | 6/2022 | Thon | C09K 11/668 |

* cited by examiner

FLEXIBLE TRANSPARENT MEMBRANE LIGHT EMITTING DIODE ARRAY AND SYSTEMS CONTAINING THE SAME

CROSS REFERENCE TO RELATED APPLICATIONS

This application is a national stage entry from International Application No. PCT/US2020/026272, filed on Apr. 1, 2020, published as International Publication No. WO 2020/206044 A1 on Oct. 8, 2020, and claims priority to U.S. Provisional Patent Application No. 62/828,707, filed Apr. 3, 2019, the entire disclosures of all of which are incorporated herein by reference.

FIELD

The present disclosure comprises materials, devices and systems that at least in part comprise certain types of light emitting diodes (LEDs), as described below. The materials are suitable for use in a wide variety of devices, systems and processes, as further described herein.

BACKGROUND

There is an ongoing, unmet need for improved compositions and systems for use in light-based systems that are used in a wide variety of application, including but not limited to motion capture, eye-tracking, augmented and virtual reality systems, simulcam technology, and camera-based systems, with reduced power consumption, scalability, tunable emission wavelengths that can be controlled during synthesis process, and other related systems. The present disclosure is pertinent to these and other needs.

SUMMARY OF THE DISCLOSURE

The present disclosure provides systems, compositions and methods that are suitable for use in a wide variety of configurations and environments where generating and tracking light is of interest. In embodiments, the disclosure provides systems that include, as one component, flexible, transparent membrane-based materials that comprise light emitting diodes (LEDs). In general, the LEDs comprise colloidal quantum dots (CQDs) as, for example, an active layer. The active layer is used in combination with other solution processed materials, as described further herein. In embodiments, the CQDs of this disclosure comprise solution-processed semiconductor nanocrystals. In this regard, unlike conventional semiconductors, the band gap energy of CQDs described herein can be easily tuned during the material synthesis by adjusting the size of the nanocrystals. Among other attributes, CQD-based LEDs of this disclosure, when used for example, in flexible, transparent membrane-based LED array, exhibit emission wavelength tunability, such as any anywhere in the range 800-2000 nm, inclusive. Further, the LEDs are highly transparent in the visible wavelength range with the exception of the CQD active layer. In embodiments, the CQD-based LEDs are components of any device or system wherein generating and/or tracking reflected light is utilized. In embodiments, the LEDs are used in tracing the location and movement of a living individual, or an inanimate object. In certain embodiments, the disclosure provides imaging devices, such as a variety of cameras, and microscopes, systems for volume capture, body motion tracking, eye tracking systems and devices, motion capture systems, simulcam technologies, computer generated characters, holograms, and may be components of any type of eye wear, such as glasses, goggles, virtual reality headsets, and medical devices that involve imaging, including but not necessarily limited to medical probes, and devices that involve imaging of the eye for diagnosing and/or treating eye disorders.

In certain embodiments, the disclosure provides a diode comprising: a flexible substrate or a curved substrate; a first electrode (e.g., a bottom electrode), wherein the electrode is disposed on at least a portion of the flexible substrate; an electron injection layer, wherein the electron injection layer is disposed on the first electrode and is in electrical contact with at least the first electrode; an emission layer comprising a plurality of quantum dots (which may be colloidal quantum dots or solution processed semiconductor nanocrystals), wherein the emission layer is disposed on the electron injection layer and is in electrical contact with at least the electron injection layer; a hole injection layer, wherein the hole injection layer is disposed on the emission layer and is in electrical contact with at least the emission layer; and a second electrode (e.g., a top electrode), wherein the second electrode is disposed on at least a portion of the hole injection layer and is in electrical contact with at least the hole injection layer, and wherein optionally one or more or all of the flexible substrate, first electrode, electron injection layer, hole injection layer, or second electrode is transparent (e.g., has 90% or greater or 95% or greater transmission of visible light wavelengths (e.g., 400 nm to 700 nm).

In certain implementations, the flexible substrate is formed from glass, a polymer, such as, for example, polyethylene terephthalate (PET), a polyester, a polyimide, a polymeric organosilicon compound or a polyamide, and the like. In non-limiting examples, the flexible substrate has a thickness of 100 microns to four millimeters.

In embodiments, a diode that is a component of an LED of this disclosure comprises CQDs in an active layer. The CQDs can comprise or consist of PbS colloidal quantum dots, PbS/CdS core shell colloidal quantum dots, PbSe colloidal quantum dots, any II-VI or III-V metal semiconductor colloidal quantum dots, and the like, and combinations thereof. In one embodiment, the active layer comprises CQDs that comprise PbS or PbS/CdS, and exhibit a 800 nm-2000 nm emission range. In embodiments, the CQDs have a size (e.g., at least one and/or longest dimension) of 1.5 to 15 nm in diameter equivalent, and wherein optionally a 2.2 nm-8 nm diameter is used to produce 800 nm-2000 nm emission. In embodiments, the CQDs exhibit an emission wavelength (e.g., a maximum emission wavelength) of 800-3000 nm, and wherein optionally, 2.2 nm-8 nm diameter colloidal are used for 800 nm-2000 nm emission, and/or wherein the colloidal quantum dot emission exhibits a full width at half maximum (FWHM) of 500 nm or less. In embodiments, the CQDs comprise or consist of colloidal core quantum dots or colloidal core-shell quantum dots.

In embodiments, a diode comprises a hole injection/electron blocking layer that comprises any one or combination of (i) a polymer such as, for example, poly(9-vinylcarbazole (PVK), and the like, (ii) an ionomer such as, for example, poly(3,4-ethylenedioxythiophene, and the like, (iii) a p-doped quantum dot film such as ethanedithiol ligated PbS colloidal quantum dots, and the like. In non-limiting examples, the hole injection/electron blocking layer has a thickness of 10 nm to 1 micron. In embodiments, a diode of this disclosure includes an electron injection/hole blocking layer comprising a metal oxide (e.g., conducting metal oxide) such as, for example, zinc oxide, and the like, or a transition metal oxide such as for example, titanium oxide (e.g., titanium dioxide, and the like), organic fullerenes, conjugated polymer donors, or n-type colloidal quantum dots, and the like, or a combination thereof. In embodiments, the hole injection layer has a thickness of 5 to 500 nanometers.

In embodiments, a diode that is a component of any material described herein has an emission layer with a thickness of 5 nm to 1 micron, including but not limited to an emission layer thickness of 5 nm to 100 nm, or 5 nm to 50 nm.

In embodiments, a first electrode comprises one or more conducting materials which include but are not necessarily limited to a metal (e.g., gold, silver, platinum, nickel, and the like), a conducting metal oxide (e.g., indium tin oxide (ITO), fluorine doped tin oxide (FTO), and the like). In embodiments, the conducting material is in the form of a nanowire (e.g., Ag nanowires and the like). In embodiments, the first electrode has a thickness of at least 20 nanometers, and optionally up or at least to 1 micron.

In embodiments, a diode of this disclosure includes a second electrode that comprises one or more conducting material, such as, for example, a metal (e.g., gold, silver, platinum, nickel, and the like), a conducting metal oxide (e.g., indium tin oxide (ITO), fluorine-doped tin oxide, and the like), or the like, and wherein optionally the conducting material comprises one or more nanowires (e.g., Ag nanowires and the like).

In one aspect, the disclosure provides a device comprising a plurality of (e.g., an array of) diodes as described herein, wherein the device is optionally transparent (e.g., has 70% or greater, 80% or greater, 90% or greater transmission of visible light wavelengths (e.g., 400 nm to 700 nm), the device optionally further comprising one or more photodetectors. In certain implementations as mentioned above, the disclosure comprises eye-tracking goggles, a motion capturing system, an infrared security system, a display (e.g., a smart display for, for example, a cellphone or heads-up display) or a dual-function medical probe that contains an array of diodes.

In a non-limiting example, the disclosure includes a garment for a motion tracking system. In this aspect, the garment comprises a fabric configured to be wearable by an individual; and two or more diodes as described herein, each diode being affixed to a position of the fabric such that at least a portion of emissions from each diode are directed outside of the garment (i.e., away from the individual when worn). In embodiments, the diodes may be attached directly to an individual, or an object.

In yet another embodiment, the disclosure provides a motion tracking system. This system includes a garment according as described above, a first receiver configured to receive emissions from the two or more diodes of the garment within a first 2-dimensional (2D) field-of-view; and a processor in electronic communication with the first receiver, the processor being programmed to determine the location of each diode within the first 2D field-of-view. The motion tracking system may further comprise a second receiver spaced apart from the first receiver, and configured to receive emissions from the two or more diodes of the garment within a second 2D field-of-view. In this embodiment, the processor can be further programmed to determine the location of each diode within the second 2D field-of-view. The processor may be further programmed to determine a three-dimensional location of each diode based on the determined positions of each diode in the first and second 2D fields-of-view.

In another implementation, the disclosure provides a device for eye-tracking. The device includes a wearable frame configured to be worn on an individual's head; and a diode as described herein that is positioned to direct at least some emissions to the eye; and a receiver configured to receive emissions from the diode and reflected by the eye; and a processor in electronic communication with the receiver, the processor being programmed to determine a position of the eye based on the emissions received at the receiver.

The disclosure includes methods of making all of the above-described embodiments, and all of the devices and systems in use, i.e., methods of using the devices, material and systems.

BRIEF DESCRIPTION OF THE FIGURES

FIG. 1 illustrates an embodiment of the present disclosure as a body suit 1 comprising a fabric suit 2. Disposed on fabric suit 2 is a plurality of active markers 3. Each of the active markers 3 may comprise a flexible integrated circuit, which may include colloidal quantum dot light-emitting diodes (CQD LEDs). Further, the active markers 3 may be wired or wirelessly connected to a central processor for controlling the CQD LEDs. Body suit 1 may enable enhanced capture of a wearer's motion.

FIGS. 2a and 2b illustrate an embodiment of the present disclosure as an eye tracker 4. Eye tracker 4 comprises eyewear 5 having printed tracker arrays 6 disposed upon eyewear 5. Each of the tracker arrays 6 may comprise a flexible integrated circuit, which may include CQD LEDs. Eyewear 5 may have a curved glass surface upon which tracker arrays 6 are disposed. Tracker arrays 6 may be interfaced with for power and data via transparent printed flexible circuits such as silver nanowire (Ag NW) circuits, which provide visibility and flexibility.

FIG. 3 illustrates a motion capture system 7 according to an embodiment of the present disclosure. A user wears body suit 1, which comprises fabric suit 2 having a plurality of active markers 3 disposed upon fabric suit 2. Optionally, a backdrop 11 is present. Camera 8 captures the location data for each of the active markers 3 and transmits the location data over communication link 10 to computer 9. Computer 9 is then used to process the location data to reconstruct the positions of each of the active markers 3. Additional processing of the location data may occur on computer 9 or another computing device.

FIG. 5 illustrates a structure of a CQD LED 14 according to embodiments of the present disclosure. CQD LED 14 comprises a plurality of layers, including flexible substrate 15, bottom electrode 16, electron injection layer 17, emission layer 18, hole injection layer 19, and top electrode 20.

FIG. 6 illustrates a socket 21 according to embodiments of the present disclosure. Socket 21 may be a lid-close socket with an array of pushpin probes. Socket 21 may comprise a base 22 and a lid 23 connected by hinge 24. Socket 21 may be mounted on shipping plate 25. Chip 26 containing CQD LED array 27 may be placed in socket 21. The electrodes on chip 26 may contact the pushpin probes to electrically connect socket 21 to the chip 26. Alternatively, the connection from chip 26 to socket 21 may be made by wire bonding. The device may emit light from the emission port 28. The device may also have indicator 29.

DETAILED DESCRIPTION

All scientific terms used herein are given their ordinary meaning, unless otherwise defined.

Unless specified to the contrary, it is intended that every maximum numerical limitation given throughout this description includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

The present disclosure provides compositions, methods, and systems that relate in part to flexible, transparent membrane-based materials that comprise light emitting diodes (LEDs).

In embodiments, a material of this disclosure comprises colloidal quantum dots (CQDs) as, for example, an active layer, together with other solution processed materials as described further below. In non-limiting embodiments, the CQDs comprise solution-processed semiconductor nanocrystals which enable convenient tuning of the band gap energy during production by, for example, adjusting the size of the nanocrystals. The CQD LEDs of this disclosure exhibit properties that are particularly useful and are uniquely suited for use in building flexible, transparent membrane-based LED arrays, and systems that use the LED arrays in a wide variety of implementations. As some examples, the CQD LEDs exhibit: Emission wavelength tunability: By tuning the size of PbS CQDs during synthesis, the emission wavelength can be tuned between approximately 800-2000 nm. Spectral emission in the 800-900 nm range is important for many applications because it is invisible to the eye, yet can be easily detected by inexpensive Si-based photodetectors. Flexible materials that emit in this range are rare. Flexibility: Materials used in the LED—including but not necessarily limited to ZnO nanoparticles for the electron-injection layer, polymers for the hole-injection layer, and silver-nanowire based transparent top and bottom electrodes—are solution-processed and therefore flexible. All layers can have thicknesses of under 1 μm, making the devices ultra-lightweight. Transparency: Materials used in the LED are highly transparent in the visible wavelength range with the exception of the CQD active layer. In embodiments, optimal thickness of the CQD active layer is only on the order of tens of nanometers, resulting in very little absorption (high transparency). Further, we have developed an optimization method for multi-layer thin-film optoelectronic devices that allows us maximization of device transparency without violating electrical performance requirement constraints using optical interference effects that we can be applied to CQD LED devices.

Conventional LEDs are made from materials that absorb strongly in the visible wavelength range, making transparency impossible to achieve. In embodiments, LEDs are made according to a suitable approach, and have desirable characteristics, such as described in E. S. Arinze, B. Qiu, N. Palmquist, Y. Cheng, Y. Lin, G. Nyirjesy, G. Qian and S. M. Thon, "Color-tuned and transparent colloidal quantum dot solar cells via optimized multilayer interference," Optics Express 25, A101-A112 (2017), from which the description of LEDs and methods of making them is incorporated herein by reference.

In more detail, and to expand the foregoing description, LEDs of this disclosure comprise multi-layer thin-film structures made from nanomaterials that include but are not necessarily limited to silver nanowires, ITO/AZO nanoparticles, ZnO nanoparticles, colloidal quantum dots and organic polymers, and all alternatives thereto that will be apparent to those skilled in the art when given the benefit of the present disclosure. In embodiments, the LED fabrication processes are scalable and do not include high-temperature processes.

Because as described above, the active layer of the LED may be made from colloidal quantum dots (e.g., semiconductor nanocrystals) with a tunable band gap that can be selected during material synthesis, the emission is narrow band and its wavelength can be customized, ranging from UV, to visible up to SWIR (short-wave infrared). Thus, emission is narrow band with Full width at half maximum (FWHM) of <100 nm. The switching response time is on the order of tens of microseconds, which means temporal modulation frequency can be as fast as 100 kHz.

Silver nanowires imbedded in an ITO/AZO nanoparticle matrix serves as composite top and bottom transparent electrodes. The ZnO nanoparticle layer is used as the electron injection (hole-blocking) layer and the organic polymer layer serves as hole injection (electron blocking) layer. All materials being synthesized in solution and all fabrication processes being solution-based give the membrane the flexibility to be coated on almost any surfaces. Active layers being tens of nanometers thick and other layers being transparent gives the whole device a high average visible transparency up to ~70%. In embodiments, the hole injection material may be a semi-conducing material (e.g., a semiconducting transition-metal oxide such as molybdenum oxide ($MoO_3$)). The hole injection material may be nanoparticles such as p-type 1,2-ethanedithiol-treated PbS colloidal quantum dots or any p-type PbS colloidal quantum dots such as benzene dithiol, mercaptopropionic acid (MPA), organic-inorganic hybrid perovskite, butylamine, pyridine, metal chalcogenide complexes (MCCs), any alkane or aromatic thiols or amines, or as described elsewhere herein.

In connection with eye tracking, when the eye of an individual is looking at a light source, the reflected light is amplified according to a phenomenon known in the art as optical augmentation, which is similar to the analogous scenario in an optical lens. A temporal modulation in the LED is sufficient to reduce the background and make a "blinking" eye easily trackable. In embodiments, the system includes one or more SOC imagers which detect and report the position of the eye with a single chip solution, meaning there is no external computing or resources required. In embodiments, suitable imagers comprise a sensing array. In embodiments, a component of a device and/or system of this disclosure comprises any component described in U.S. Pat. No. 9,200,954, the entire disclosure of which is incorporated herein by reference. In embodiments, a device, system and/or method of this disclosure comprises a Flexible Readout and Integration Sensor (FRIS). In embodiments, only a single imager with optical reflectors is sufficient. In embodiments, such components are placed on the goggles, eye glasses or other eyewear to provide for full coverage of the eye motion. The imager chip can be configured to wirelessly interface with any other component, including but not limited to Bluetooth, Wi-Fi, etc. The imaging chip can also act as the controller for the LEDs. In embodiments, a device, system and/or method of this disclosure implements eye tracking by adapting known approaches to function with the novel combination of components described herein, such techniques including but not limited to the description in "Key Techniques of Eye Gaze Tracking Based on Pupil Corneal Reflection" (Chi Jian-nan, et al., 10.1109/GCIS.2009.338, January 2009) and "Point of Gaze Estimation through Corneal Surface Reflection in an Active Illumination Environment" Nakazawa A., et al. (2012) In: Fitzgibbon A., Lazebnik S., Perona P., Sato Y., Schmid C. (eds) Computer Vision—ECCV 2012. ECCV 2012. Lecture Notes in Computer Science, vol 7573. Springer, Berlin, Heidelberg; the disclosures of each of which are incorporated herein by reference.

Figure 1:
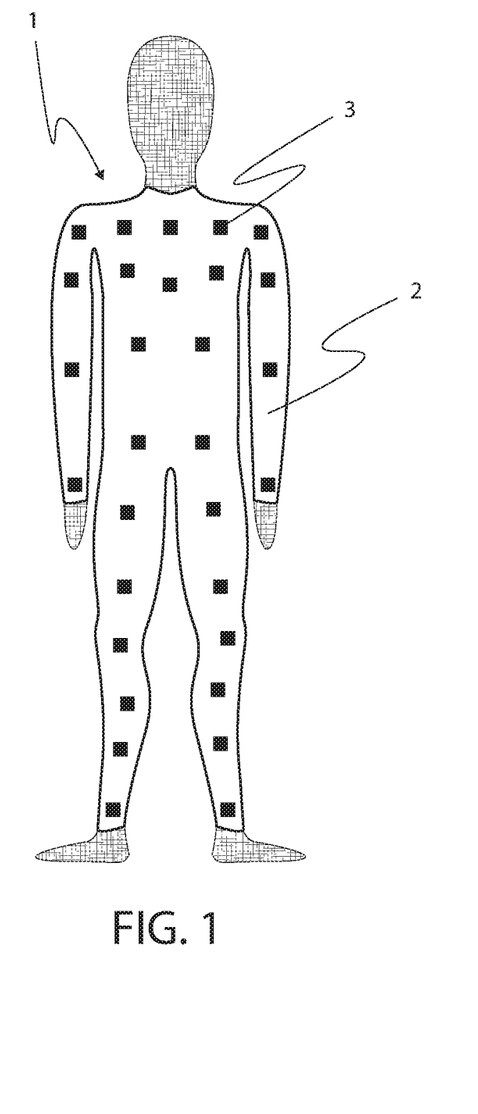

Certain non-limiting embodiments are shown by way of the figures. In particular, FIG. 1 illustrates an embodiment of the present disclosure as a body suit 1 comprising a fabric suit 2. Disposed on fabric suit 2 is a plurality of active markers 3. Each of the active markers 3 may comprise a flexible integrated circuit, which may include colloidal quantum dot light-emitting diodes (CQD LEDs). Further, the active markers 3 may be wired or wirelessly connected to a central processor for controlling the CQD LEDs. Body suit 1 may enable enhanced capture of a wearer's motion.

Figure 2A:
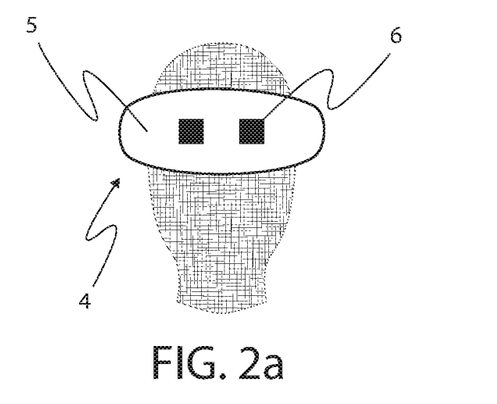
Figure 2B:
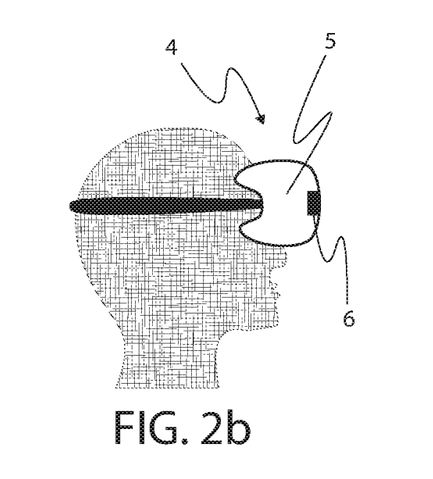

FIGS. 2a and 2b illustrate an embodiment of the present disclosure as an eye tracker 4. Eye tracker 4 comprises eyewear 5 having printed tracker arrays 6 disposed upon eyewear 5. Each of the tracker arrays 6 may comprise a flexible integrated circuit, which may include CQD LEDs. Eyewear 5 may have a curved glass surface upon which tracker arrays 6 are disposed. Tracker arrays 6 may be interfaced with for power and data via transparent printed flexible circuits such as silver nanowire (Ag NW) circuits, which provide visibility and flexibility.

Figure 3:
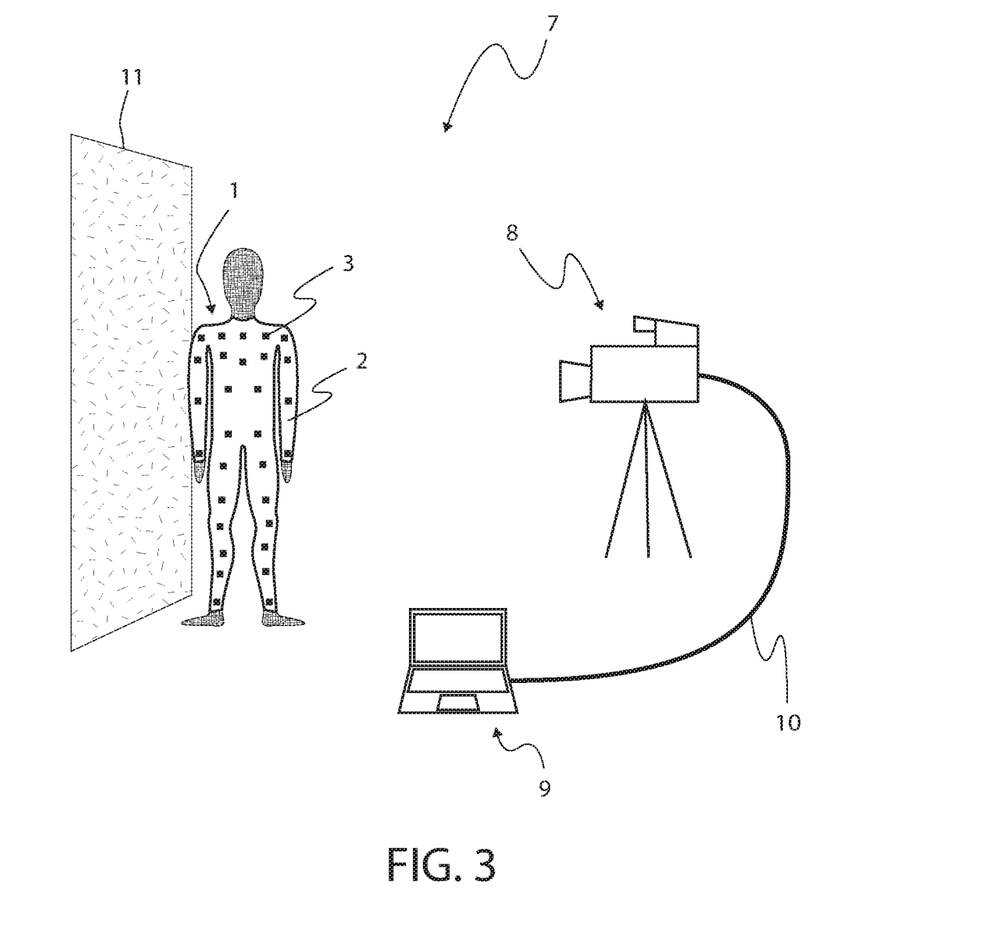

FIG. 3 illustrates a motion capture system 7 according to an embodiment of the present disclosure. A user wears body suit 1, which comprises fabric suit 2 having a plurality of active markers 3 disposed upon fabric suit 2. Optionally, a backdrop 11 is present. Camera 8 captures the location data for each of the active markers 3 and transmits the location data over communication link 10 to computer 9. Computer 9 is then used to process the location data to reconstruct the positions of each of the active markers 3. Additional processing of the location data may occur on computer 9 or another computing device.

Figure 4:
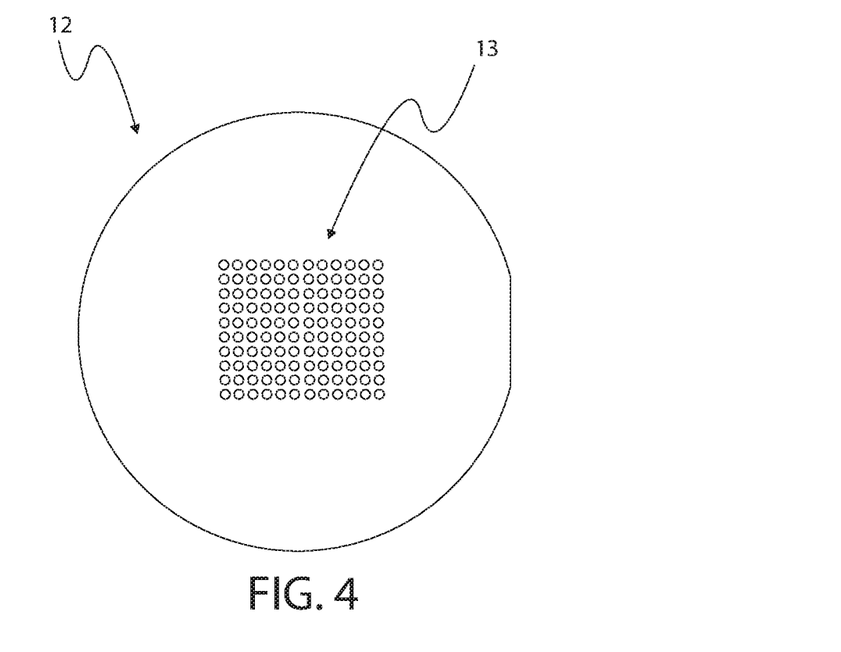
FIG. 4 illustrates a wafer 12 according to embodiments of the present disclosure for manufacturing CQD LED arrays 13. CQD LED arrays 13 may further comprise integrated circuits.

FIG. 4 illustrates a wafer 12 according to embodiments of the present disclosure for manufacturing CQD LED arrays 13. CQD LED arrays 13 may further comprise integrated circuits.

Figure 5:
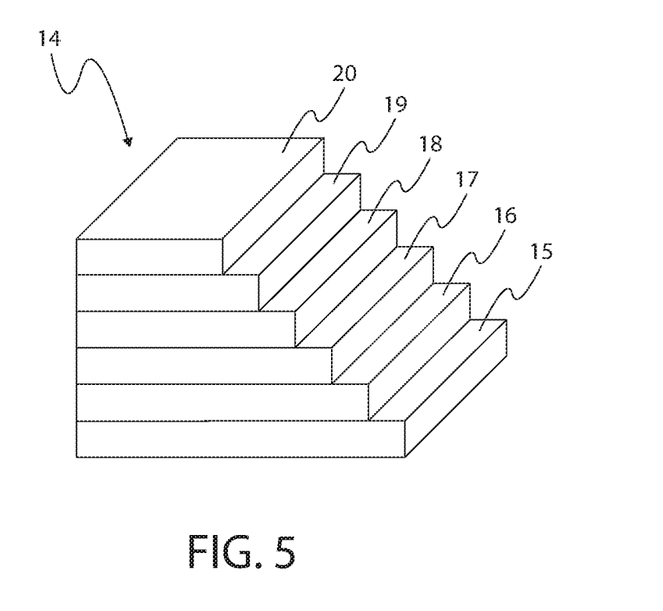

FIG. 5 illustrates a structure of a CQD LED 14 according to embodiments of the present disclosure. CQD LED 14 comprises a plurality of layers, including flexible substrate 15, bottom electrode 16, electron injection layer 17, emission layer 18, hole injection layer 19, and top electrode 20.

Figure 6:
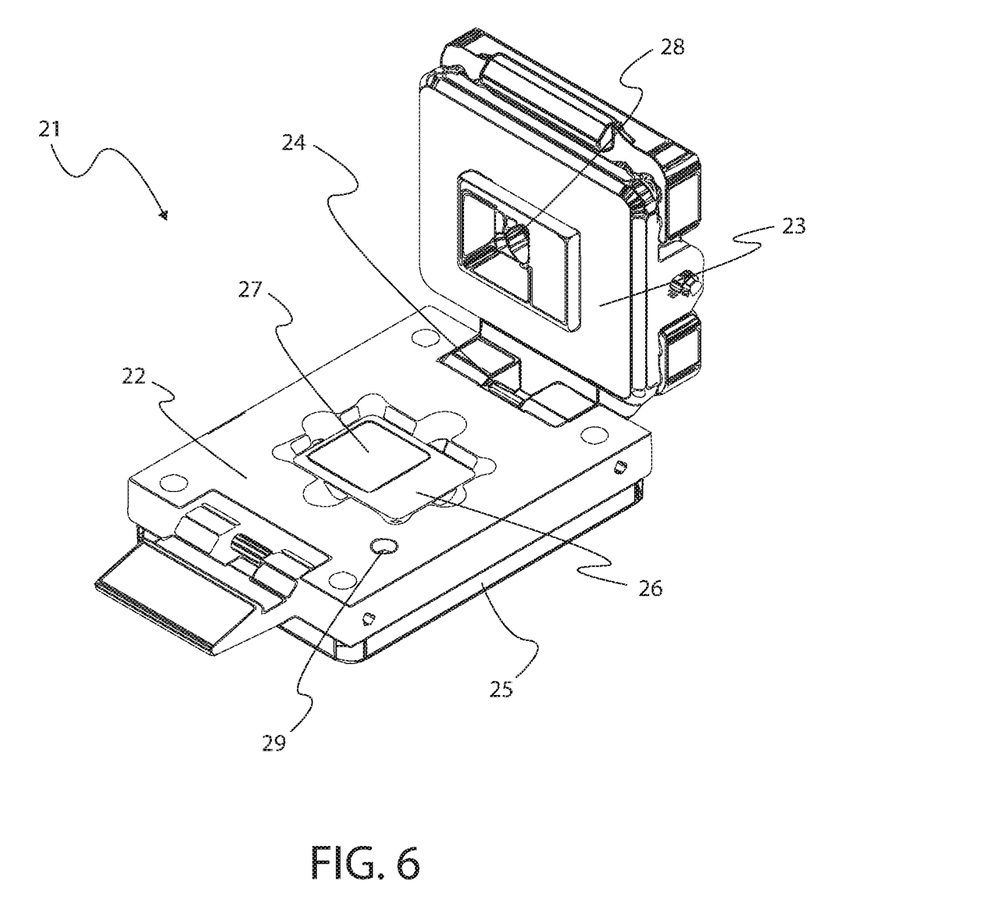

FIG. 6 illustrates a socket 21 according to embodiments of the present disclosure. Socket 21 may be a lid-close socket with an array of pushpin probes. Socket 21 may comprise a base 22 and a lid 23 connected by hinge 24. Socket 21 may be mounted on shipping plate 25. Chip 26 containing CQD LED array 27 may be placed in socket 21. The electrodes on chip 26 may contact the pushpin probes to electrically connect socket 21 to the chip 26. Alternatively, the connection from chip 26 to socket 21 may be made by wire bonding. The device may emit light from the emission port 28.

In some embodiments, socket 21 may be mounted on a PCB board and a microcontroller may be connected to the PCB board to enable individual control & modulation of the CQD LEDs.

Any of the components described herein can be integrated with one another, or may be provided separately. Redundant functions or structures of the components can be included. Various components may be situated locally and/or remotely with any user or machine/system/computer/processor. The LED materials of this disclosure can be provided in any shape along the continual geometric spectrum of x, y and z planes to meet any structural demands and/or functional requirements. Various sizes, dimensions, curvatures, stiffness, and flexibility of any of the LED-containing components or portions of can be varied.

In another aspect, the flexible and transparent membrane of LED arrays described herein is expected to be suitable to replace the bulky motion-capture suit because it is lightweight and can be integrated into normal clothes, e.g., garments that are not specifically produced for the purpose of use during motion capture. For instance, in one non-limiting embodiment, with a novel motion-capture system integrated with actor's original costume, the complexity of computing graphics to rebuild the scene will be mitigated and actor's motions will be much more natural. In embodiments, aspects of the device are integrated with any suitable high speed image processing device and/or software, non-limiting examples of which are described in U.S. Pat. No. 9,835,642, the entire disclosure of which is incorporated herein by reference.

In another aspect, tuning the emission to be within the visible range the flexible and transparent membrane of light-emitting array can be used for smart display such as cell phone case or head-up display on car windshields. Being transparent and lightweight, it does not disturb the aesthetic design and adds display function to existing surfaces regardless of the curvature of that surface.

In another aspect, the flexible and transparent membrane of a light-emitting array component provided by this disclosure can be coated on a variety of medical probes to give existing probes a dual imaging function, thereby serving as a local source for bio imaging.

The emission wavelength can be tuned to cover the specific optical imaging window of specific human tissue.

In another aspect, the transparent and lightweight features also make the membrane of an LED array described herein suitable for use as an invisible security monitoring source. For example, the membrane can be coated on existing objects and is difficult to identify, making the source less vulnerable.

In embodiments, the flexible and transparent membrane of a light-emitting diode array of this disclosure can be used for photobiomodulation as an approach to treat a variety of retinal conditions including but not necessarily limited to age-related macular degeneration, retinopathy of prematurity, diabetic retinopathy, Leber's hereditary optic neuropathy, amblyopia, methanol-induced retinal damage, and potentially other eye disorders.

In another aspect, the disclosure provides for eye movement tracking, such as in eyewear that is suitable for, as one example, virtual reality applications. In this regard, the disclosure includes in one implementation use of the transparent membrane to allow visible light to be transmitted through for goggle display, but would also emit invisible (>800 nm wavelength) light to illuminate the eye. This eye tracking solution uses the optical augmentation of the eye at the specific light wavelength to provide high speed tracking of the eye with minimal light conditions. This approach also incorporates one or more sensor-on-chip that can track the eyes and provide the location feedback to the goggle or other headset/eyewear system. This feedback can also be used to provide localized illumination based on eye position. In this regard, since the membranes described herein involve an array of light emitting diodes, the array can be divided into a plurality of sections where only certain sections are illuminated, depending on the location of the eyes. Another implementation of the eye tracking approach comprises operating some or all of the LEDs in the membrane as detectors. One non-limiting example is to provide, for example, a checker-board layout where some diodes operate as illuminators and others operate as detectors. In embodiments, the detector is not placed on a transparent section of a goggle or other eyewear. In embodiments, a detector component of this disclosure comprises detector pixels that are made suitably small, and alternated with transparent emitter pixels, so that the impact of the presence of the detector on transparency is reduced.

The eye tracking functionality may be integrated with the head display. In yet another embodiment, the disclosure provides for use of one or more membranes that have illumination in the visible and invisible spectrum, the first to provide the display and the second for eye tracking. As discussed above, the diodes operating in the invisible range may involve either or both modes: light emission and/or detection.

In another aspect, the disclosure provides devices and systems for body motion tracking. One non-limiting example for this approach is the film industry. Currently, for human look-alike animated movies, the actors and actresses have to wear specific suites that are wired to record their movements, which is achieved in highly customized rooms. In embodiments, the present disclosure facilitates the acting taking place in the actual surroundings with actors wearing normal clothing that has been adapted to include LEDs of this disclosure. The transparent light emitting membranes of this disclosure can be easily integrated into the outfits and clothes and provide the illumination of specific locations on the body of the individual. A high speed imaging sensor can then track the body movements with high fidelity and speed. Furthermore, if the illumination is synchronized with the image capture, this present disclosure can also provide 3D (depth data) representation.

It will be recognized from the foregoing that in embodiments, the LEDs of this disclosure generate a signal. In embodiments, the signal is interpreted by a sensor that is a component of a system or device of this disclosure. Thus, the device may comprise any suitable sensor for detecting any signal generated by the LED material, and the LED material itself may function as a sensor.

The LED material and/or the sensor component can be connected to various components, such as a camera, computer and/or microprocessor such that any single or combination of signal characteristics can be detected, measured, quantified, located, tracked, or otherwise determined. The signal can be tracked, for example, by running software which may be customized for any particular application. Systems comprising suitable computers and/or microprocessors in communication with a device and/or the materials of this disclosure are included within the scope of the invention. In embodiments, a device and/or system of this disclosure is configured to be capable of Wi-Fi or Bluetooth communication with another component that can, for example, control and/or detect and/or record any aspect of the signal generated by the LEDs. In embodiments, information obtained by the device/system can be monitored in real-time by a computer, and/or by a human operator. In certain embodiments, the disclosure provides as an embodiment or component of the system a non-transitory computer readable storage media for use in performing an algorithm to control signal generation and/or detection, and/or for monitoring and/or recording signaling events. In certain embodiments a device of this disclosure comprises microprocessor wherein the microprocessor is a component of an Arduino board, and wherein the device further comprises a suitable Arduino Wi-Fi shield. In embodiments, a system described herein may operate in a networked environment using logical connections to one or more remote computers.

In various approaches, a material of this disclosure is used in the production of a fiber, or a textile, such as a cloth, fabric or thread. In certain embodiments, a material comprising LEDs described herein are used to make, impregnate or coat a material, such as a garment, or a medical device, or a component of eyewear. Thus, in embodiments, a composition of this disclosure can be painted, printed, coated or otherwise applied to any surface. In embodiments, the disclosure comprises paintable and/or printable compositions that may be disposed on a surface using any suitable device or technique. In embodiments, the disclosure comprises composite material comprising at least one two-dimensional (2D) layer. In various embodiments the disclosure comprises inks or paints, wherein the inks or paints comprise materials described herein that are capable of being layered, as well as layered materials comprising or consisting of the inks/paints. In embodiments, a composition of this disclosure thus comprises a printable ink. In an aspect, the disclosure provides a closed vessel containing the materials described herein in a form that is suitable for printing. The vessel can be, for example, a disposable or reusable ink cartridge. Thus, the disclosure includes devices and systems for making compositions of this disclosure.

In embodiments, the disclosure includes depositing the LED compositions described herein on a substrate in a desired pattern or print. In one aspect, the step of depositing the composition onto a substrate comprises using a printing technique, including but not limited to lithographic, extrusion-based, droplet-based (such as inkjet, micro-valve, acoustic, electrohydrodynamic printing) or laser-based techniques (such as laser-assisted printing, laser-induced forward transfer, matrix-assisted pulsed laser evaporation). In embodiments, the composition that is used in, for example, a printing technique, comprises a specific concentration of the colloidal quantum dots (CQDs) described herein as an active layer, and/or the CQDs fall within a specific concentration range.

In embodiments, the LED materials described herein are in contact with any substrate. In embodiments, the substrates are flexible, but they need not be. Thus, the substrates can be flat, stiff, flexible, rough, smooth, or patterned. Non-limiting examples of suitable substrate materials to the extent not described elsewhere in this document include polymer substrates (e.g., plastics, PET, and acrylic), glass, metals, silicon, quartz, cellulosic materials (e.g., paper, cardboard etc.), or any other suitable substrate known in the art. As also described herein, in certain embodiments the substrate is a textile, and thus may comprise a fabric of any known type. Combinations of substrates may be used. In various embodiments, the present disclosure provides substrates onto which a composition of the disclosure has been deposited.

With respect to garments, the application and configuration of the LEDs on the garment is not particularly limited. In non-limiting embodiments, the garment may be painted, printed, coated, spotted, or partially formed by the LEDs, or another material that is used to make the garment can be, for example, impregnated or coated or otherwise contacted with the LEDs. In embodiments, a garment is has a plurality of distinct locations each comprising a material described herein, including but not limited to a film comprising or consisting of the LED material. In embodiments, the garment comprises a covering that may be, for example, worn such that is in contact with the skin or an undergarment of the user. In embodiments, the garment comprises a shirt, pants, gloves, socks, shoes, a hat, cap, etc. In embodiments, the garment is a body suit. In embodiments, the disclosure provides a wearable insert. The garment may designed for any activity, including athletic and recreational activities, or designed for normal use, or for creation of motion pictures, and/or computer or other console or mobile device-based audiovisual works, including but not limited to motion pictures of any kind, and digital games. In embodiments, the garment is a component of a motion capture system, some examples of which are descried herein and are otherwise known in the art.

In embodiments, a product provided by this disclosure may comprise a pad or other single or multi-layered article that can be applied to any surface, object or individual. In embodiments, a garment or other article of manufacture comprising LEDs described herein is reusable, or is disposable. In embodiments, LED material provided herein is disposed on a substrate that has, for example, an adhesive backing and thus the LED material can be reversibly or irreversibly positioned on a wide variety of surfaces.

In embodiments, the disclosure provides systems that incorporate materials described herein, which include but are not limited to systems that include imaging devices, such as a variety of cameras, and microscopes. In embodiments, the imaging device is a component of a motion capture system. In general, motion capture systems comprise optical systems, and utilize visible and/or invisible light and cameras to detect the presence of an individual and/or an object in one or more fields of view. Motion capture systems/cameras of this disclosure may comprise an illuminator and an image sensor which senses light from the illuminator in a field of view, and may use the light to form an image. The illuminator may include a light source that comprises or consists of LEDs described herein. The LEDs in certain approaches may also function as sensors. In embodiments, a material of this disclosure is accordingly a component of a system that comprises a camera, wherein the camera is configured to receive signals produced by the material, and/or the material provides the light source. In embodiments, a system of this disclosure includes any suitable camera, non-limiting embodiments of which include a 3-D depth camera. In embodiments, a motion capture system described herein is connected to an audiovisual device such as a display, such as a television, a monitor, a high-definition television, etc. In embodiments, the LEDs components of the motion capture system provide modulated light output in a time-of-flight depth sensing scheme, or provide a constant light output in a structured light depth sensing scheme. In an embodiment, a device, component or system described herein comprises a diffractive optical element (DOE), including but not limited to an achromatic diffractive optical element. In embodiments, an LED of this disclosure comprises a superluminescent light-emitting diode (SLED). In embodiments, a device and/or system of this disclosure comprises a lens. In embodiments, the lens is a collimating lens, and/or a microlens.

In certain approaches, motion capture systems that use an LED material described herein obtain data that indicate the location and movement of a subject, such as a human or non-human animal body, or any other object, in physical space, wherein the data are used as an input to a computing system. In embodiments, a motion capture system (or any other implementation of the LED materials described herein) can be used in a variety of settings, which include but are not limited to entertainment, medical, athletic and military purposes. In embodiments, the motion of any living or inanimate object can be mapped to three-dimensional (3-D) models. In embodiments, a human or non-human animal skeletal model is created. In embodiments, the model is used to create a virtual representation of the animal or object, such as by way of an animated character, and/or avatar. Thus, certain implementations, facial, skeleton, skin, and clothing motion capture (also referred to as "mocap"), involve attaching small LED markers described herein to the joints and/or skin and/or clothing to allow for motion capture of these points, and thus the LED markers constitute active markers. In alternative approaches, the LEDs described herein can be used for improving simulcam technology, such as the virtual colored line markers during sporting events, such as American football games, and for creation of computer generated (CG) characters, holograms, and the like.

The active markers can be wired or battery powered or harvest energy from the body motion and/or heat. In embodiments, a suitable power source provides a sufficient power, such as 75-200 milliwatts. An active marker of an area of 0.04 cm$^2$ would typically consume a few milliwatts.

In embodiments, a component, device or system described herein may be integrated into commercially provided motion capture systems. In a non-limiting example, motion capture systems and processes sold under the trade name VICON®, or similar systems, can be adapted to use the presently provided LED materials, which would be expected to reduce the cost of the cameras, improve camera performance, improve and/or create portability, provide indoor and outdoor capabilities by, for example, functioning in water windows to avoid sun light interference, reduce or eliminate the need for synching the cameras with each marker having a unique identifier, and may reduce the number of cameras needed.

In certain approaches, the disclosure supports using cameras on moving platforms such as ground, water, air, and sub-water vehicles. In embodiments, the LEDs of this disclosure facilitate making personnel involved in configuring and/or operating mocap become invisible and/or unobtrusive. In certain embodiments, the LEDs of this disclosure improve accuracy issues, such as for interactive scenes, where simulation of interaction with physical surroundings is improved (e.g., the interaction between a foot and floor requires more data than simple leg walking). Likewise, modeling the interaction of fingers with objects, or bringing body parts together, could be improved by using embodiments of this disclosure. LEDs described herein would also reduce costs of pertinent devices and systems.

In certain approaches, the presently provided active markers could be used as fixed reference points to register the views of multiple cameras. In embodiments, the markers can be used to track the camera position and orientation.

In embodiments, the disclosure provides improved approached to volume capture, such as 3D scanning (LIDAR), such as by reducing the power requirement by $1/R^2$, and by improving texture in meshes.

In embodiments, the disclosure provides improved approaches to match moving, i.e., a cinematic technique for inserting computer graphics into live-action footage. In embodiments, the disclosure provides for improvements in match moving position, scale, orientation, and/or motion, relative to a reference, such as a photographed object.

In another aspect, and as described above, the LEDs described herein can be used for eye tracking. In one embodiment, a system of this disclosure provides the exact location of the iris for eye-tracking, and there is no particular limit to how fast this can be performed.

In embodiments, a system of this disclosure comprises a computer, a gaming system or gaming console. In embodiments, the gaming system is a component of a system for, for example, a virtual reality system that includes eye tracking.

The following Example provides a non-limiting description of embodiments of this disclosure.

Example 1

In embodiments, the LEDs of this disclosure are made according to the following process, which may be modified by those skilled in the art when given the benefit of the present disclosure. The disclosure includes alternatives and substitutions for each element, compound, and material in the following description. It will be apparent to those skilled in the art that some or all of these steps can be performed sequentially, and some steps may be performed concurrently. The disclosure includes omitting or modifying any step or sequence of steps.

Materials Preparation:
  Transparent conductor oxide (TCO) coated glass substrate (a non-limiting example of which is a 1" by 1" substrate), such as a glass substrate coated with Indium Tin Oxide (ITO) or Fluorine doped Tin Oxide (FTO), is provided. For flexible devices, suitable flexible substrates include but are not limited to ITO-coated Polyethylene Terephthalate (PET) film or Ag nanowire (NW) coated PET film. Ag NW deposition can be performed using any suitable method, including but not limited to spin-coating, spray coating and ink-jet printing. In embodiments, Ag nanowires (NWs) length are preferably on the order of tens of micrometers and diameter <100 nm to provide a suitable transparent electrode layer.
  As an example, a TCO coated substrate is provided, and cleaned by, for instance, a 3-step sonication: in Triton X-100 aqueous solution, in IPA and in DI water, 30 minutes each. The substrates are dried using $N_2$ and are then suitable for deposition of upper layers.
  For PET film, as an example, a 1" by 1" standard size is used to facilitate efficient processing. The same aforementioned 3-step cleaning process can be used, with an exception in that of the substrate is not coated with ITO, then it is immersed in water, such as for an overnight period, or a mild $O_2$ plasma treatment is applied to it to improve hydrophilicity. In certain approaches, the following non-limiting techniques are used: Spin-coat at 1500 rpm for 30 s using 2 mg/ml Ag NWs in IPA solution, or spray coat with 60 s/60 s on/dry circle for 8 minutes total using 0.1 mg/ml Ag NWs in IPA to construct transparent electrode made of Ag NW network. This yields a transparent electrode with suitable transparency and conductivity performance to be used for devices described herein.

The following are representative steps for preparing a ZnO or Magnesium-doped ZnO ($Zn_{1-x}Mg_xO$) nanocrystals (NCs) solution for electron injection/hole blocking layer.
  Stir 0.0623M Zn in 2-methoxyethanol for 10 minutes.
  Stir 0.134M Tetramethylammonium Hydroxide in 2-methoxyethanol and slowly add to Zn solution.
  Stir the mixed solution for 1 minute and add 2-Ethanolamine (4 ml) to stabilize the particles.
  Wash the mixed solution with Toluene and Hexane at 1(mixed solution):2(Toluene):1(Hexane) v:v ratio. ZnO NCs precipitate and the solution will become translucent. Centrifuge and discard the supernatant.
  Disperse the ZnO NCs in IPA and Methanol mixed solution at 20 (original mixed solution): 4(IPA):1 (Methanol) v:v ratio to prepare a ready for use ZnO NCs for deposition.
  $Zn_{1-x}Mg_xO$ nanocrystals can be synthesized based on previously described approaches, and the energy level positions can be adjusted by adjusting the molar concentration of cation ($Zn^{2+}$ and $Mg^{2+}$) while keeping other parameters fixed.

The following are representative steps for preparing a PbS Colloidal Quantum Dots (CQDs) or PbS/CdS core-shell CQDs stock solution with a target emission wavelength for the emission layer:
  Using a suitable hot injection method, emission wavelength is controlled by injection temperature; Oleic Acid (OA) concentration and cooling conditions are determined empirically: for example, for a standard 1.5 ml OA per batch, injection at 120° C. without active cooling yields about 3.1-3.2 nm CQDs with an excitation peak of about 950 nm and photoluminescence (PL) around 1100 nm.
    1. Prepare Pb Oleate solution by pumping Oleic Acid (OA) and PbO in degassed ODE (1-Octadecene) at 105° C. for 16 hours. Add 0.45 g PbO, 3 ml ODE and determine the amount of OA per batch.
    2. Inject 15 ml degassed ODE into flask. Apply heating mantle and thermocouple with temperature controller. Inject $(TMS)_2S$ (Hexamethyldisilathiane) in ODE solution into Pb Oleate solution at appropriate temperature then remove heating mantle. Use 210 μL $(TMS)_2S$ in 10 ml ODE per batch.
    3. Apply active cooling (such as a water bath or ice bath) if very small size of CQDs (very short emission wavelength. i.e., approximately 950 nm) are desired.
    4. After the solution reaches 36° C., add 20 ml distilled Acetone into the flask. Add Toluene for the PbS CQDs to precipitate, centrifuge and discard the supernatant. Disperse the PbS CQDs in Toluene.
    5. Wash the PbS CQDs twice with methanol (1:1 v:v washing). Dry and weigh the test tubes to calculate the yield.
    6. Disperse PbS nanocrystals in Octane at 50 mg/ml as final stock PbS CQDs in Octane stock solution.
  PbS/CdS core-shell CQDs are prepared, in one embodiment, by a cation-exchange method. To control shell thickness, the exchange is performed at 80 to 100° C. for between 5 min and 2 hours under nitrogen using an excess of cadmium oleate.

Take, for example, a few drops (such as several milliliters) of stock CQD solution, confirm formation of CQDs by taking absorbance spectra and measure solution photoluminescence (PL) spectra.

1,6 Hexaneditiol ligands are used for ligand exchange process in a PbS CQD film deposition.

4,4-bis(carbazole-9-yl)biphenyl (CBP) or poly(9-vinlycarbazole) (PVK) or poly(9,9'-dioctylfluorene) (F8) are used for the hole transporting/electron blocking layer.

$MoO_3$ and Ag evaporation materials (evaporation for composite electrode) and shadow mask for creating LED array pattern are used. For a representative transparent and flexible device, Ag NWs solution and shadow mask can be used for spray-coating the top electrode to create LED patterns. Ink-jet printing of Ag NWs may be used to create LED array patterns.

Device Fabrication and Analysis of Function

As one non-limiting approach, spin coating can be employed for device fabrication, as follows. However, the spin-coating processes described herein can be replaced with ink-jet printing process or spray-coating and other solution-processed fabrication methods with modifications that will be apparent to those skilled in the art, given the benefit of the present disclosure.

1. Place a clean TCO coated glass substrate or ITO coated PET film adhered on glass substrate or Ag NW coated PET film adhered on glass substrate onto a spin-coater, and center it.
2. Spin-cast a few (e.g., 2-6) layers of ZnO or MZO NCs solution through a 0.2 μm filter at 1200 rpm for 30 s to form a layer ~100-150 nm thick layer. Wipe the edge with IPA to expose bottom electrode contact. Anneal at 120° C. for ~20 minutes to evaporate extra solvent.
3. Spin-cast PbS or PbS/CdS core shell CQD in Octane solution through a 0.2 μm filter at 2500 rpm for 10 seconds (s), then drop 1% v:v 1,6 Hexaneditiol in methanol solution onto the substrate. Allow 30 s for ligand exchange to occur (1,6 Hexaneditiol replacing oleic acid ligand). Remove extra ligand twice with methanol washing at 2500 rpm for 10 s. This will yield a ~30 nm thick emission layer.
4. Use a blade or other suitable implement to remove PbS or PbS/CdS QD film that covers the bottom electrode area to expose bottom electrode contact.
5. Spin-cast hole transporting materials solution at optimized rpm and concentration to tune layer thickness. As a non-limiting example: F8 in chlorobenzene at or PVK in 0-Dichlorobenzene can be used. The CBP layer can be evaporated using, for example, a thermal evaporator.
6. Place substrates into evaporation shadow mask, evaporate 8 nm $MoO_3$ then 150 nm Ag to form top composite electrode using E-beam evaporator. For a transparent and flexible device, in an embodiment, Ag NWs are spray coated over a shadow mask, or are ink-jet printed to make a top electrode and create LED array patterns.
7. Measure the electroluminescence (EL) of the LED device with, for example, a spectrometer, by contacting top and bottom electrodes with probes and sourcing with Keithley 2400. Trace the power output using Thorlabs powermeter.

Device Packaging

In one approach, a socket is mounted on a PCB breakout board and a microcontroller is connected to the PCB board to enable individual control & modulation of the LED devices.

Two methods representative methods of packaging include but are not necessarily limited to:
1. Wire bonding to socket
   The connection from LED electrodes to testing sockets can be made by wire bonding. The device emits light from the bottom (back) open exit.
2. Pushpin probes integrated socket
   The electrodes contact the pushpin probes and are electrically connected to the lid-close socket that is mounted on the PCB breakout board. The device will emit light from the top open exit.

Optics for LED array can be designed through, for example, a process/device used in connection with simulation software sold commercially available in association with the tradename ZEMAX, and fabricated using 3D-printed mold to cast PDMS lens to be integrated onto the substrate. In embodiments, such approaches are performed as described in Lin, G. Ung, B. Qiu, G. Qian and S. M. Thon, "Integrated Concentrators for Scalable High-Power Generation from Colloidal Quantum Dot Solar Cells," ACS Applied Energy Materials 1, 2592-2599 (2018), the disclosure of which is incorporated herein by reference.

In embodiments, any device, component and/or system of this disclosure may be incorporated into flexible electronics. In particular, eye tracking approaches comprise in certain embodiments printing the LED arrays on curved glass surfaces. Power & communication channels can be provided through transparent printed flexible circuits such as Ag NWs circuits to give substantial visibility and flexibility.

In embodiments, motion-capture implementations can comprise an integrated IC chip for LED control, communication can be achieved over wires, fiber, and/or wireless such as Bluetooth, as described above. Hard connections such as wires and fibers provide a power supply and 2-way communication, and may themselves act as markers as well. Flexible and stretchable wires as well as substrates can be incorporated to enable efficient integration of the motion-capture system with normal clothes surface.

While the disclosure has been particularly shown and described with reference to specific embodiments, it should be understood by those having skill in the art that various changes in form and detail may be made therein without departing from the spirit and scope of the present disclosure as disclosed herein.

What is claimed is:

1. A diode comprising:
   a flexible substrate or a curved substrate;
   a first electrode, wherein the electrode is disposed on at least a portion of the flexible substrate or at least a portion of the curved substrate;
   an electron injection layer, wherein the electron injection layer is disposed on the first electrode and is in electrical contact with at least the first electrode;
   an emission layer comprising a plurality of quantum dots which comprise colloidal quantum dots (CQDs) or solution processed semiconductor nanocrystals, wherein the emission layer is disposed on the electron injection layer and is in electrical contact with at least the electron injection layer;
   a hole injection layer, wherein the hole injection layer is disposed on the emission layer and is in electrical contact with at least the emission layer; and
   a second electrode, wherein the second electrode is disposed on at least a portion of the hole injection layer and is in electrical contact with at least the hole injection layer, and wherein from one or more or all of the flexible substrate, first electrode, electron injection layer, hole injection layer, or second electrode has 90% or greater or 95% or greater transmission of visible light wavelengths, wherein the visible wavelength is from 400 nm to 700 nm; and wherein the first electrode or the second electrode comprises a nanowire embedded in a transparent nanoparticle matrix.

2. The diode according to claim 1, wherein the flexible substrate comprises, glass, a polymer that is polyethylene terephthalate (PET), a polyester, a polyimide, a polymeric organosilicon compound, or a polyamide.

3. The diode according to claim 2, wherein the flexible substrate has a thickness of 100 microns to four millimeters.

4. The diode according to claim 1, wherein the first electrode comprises one or more conducting materials that are gold, silver, platinum, or nickel, a conducting metal oxide that is indium tin oxide (ITO) or fluorine doped tin oxide (FTO), and wherein the nanowire comprises an Ag nanowire.

5. The diode according to claim 4, wherein the first electrode has a thickness of at least 20 nanometers, and optionally up or at least to 1 micron.

6. The diode according to claim 1, wherein the hole injection and/or an electron blocking layer comprises (i) a polymer that is optionally poly(9-vinylcarbazole) (PVK), (ii) an ionomer that is optionally poly(3,4-ethylenedioxythiophene), (iii) a p-doped quantum dot film that is optionally ethanedithiol ligated PbS colloidal quantum dots, or a combination thereof.

7. The diode according to claim 6, wherein the hole injection/electron blocking layer has a thickness of 10 nm to 1 micron.

8. The diode according to claim 1, comprising the CQDs, and wherein the CQDs are selected from PbS CQDs, PbS/CdS core shell CQDs, PbSe CQDs, any II-VI or III-V semiconductor CQDs, and combinations thereof, and wherein an active layer comprises the CQDs, and wherein optionally PbS and PbS/CdS is used for a 800 nm-2000 nm emission range.

9. The diode according to claim 8, wherein the CQDs have a least one dimension of 1.5 to 15 nm in diameter equivalent, and wherein a 2.2 nm-8 nm diameter is used to produce 800 nm-2000 nm emission.

10. The diode according to claim 9, wherein the colloidal quantum dots exhibit an emission wavelength of 800-3000 nm, and wherein 2.2 nm-8 nm diameter CQDs are used for 800 nm-2000 nm emission, and/or wherein the CQD emission exhibits a full width at half maximum (FWHM) of 500 nm or less.

11. The diode of claim 8 wherein the CQDs are colloidal core quantum dots or colloidal core-shell quantum dots.

12. The diode of claim 11, wherein the emission layer has a thickness of 5 nm to 1 micron, 5 nm to 100 nm, or 5 nm to 50 nm.

13. The diode according to claim 8, wherein the electron injection layer comprises a conducting metal oxide that is optionally zinc oxide, or a transition metal oxide that is optionally titanium oxide or titanium dioxide, organic fullerenes, conjugated polymer donors, or n-type CQDs, or a combination thereof.

14. The diode according to claim 1, wherein the hole injection layer has a thickness of 5 to 500 nanometers.

15. The diode according to claim 1, wherein the second electrode comprises one or more conducting material that is a metal that is optionally gold, silver, platinum, or nickel, a conducting metal oxide that is optionally indium tin oxide (ITO) or fluorine-doped tin oxide, and wherein optionally the conducting material comprises one or more nanowires.

16. The diode according to claim 1, wherein the second electrode has a thickness of 20 nm to 5 microns.

17. A device comprising a plurality of diodes according claim 8, wherein the device is optionally has 70%, 80%, 90%, or greater transmission of visible light wavelength that is 400 nm to 700 nm, the device optionally further comprising one or more photodetectors.

18. The device according to claim 17, wherein the device comprises eye-tracking goggles, a motion capturing system, an infrared security system, a display that is optionally a smart display that is optionally a cellphone or a heads-up display, or a dual-function medical probe.

19. A garment for a motion tracking system, the garment comprising:
a fabric configured to be wearable by an individual; and
two or more diodes according claim 8, each diode being affixed to a position of the fabric such that at least a portion of emissions from each diode are directed outside of the garment such that the emissions are away from the individual when the garment is worn by the individual.

20. A motion tracking system, comprising:
a garment according to claim 19;
a first receiver configured to receive emissions from the two or more diodes of the garment within a first 2-dimensional (2D) field-of-view; and
a processor in electronic communication with the first receiver, the processor being programmed to determine the location of each diode within the first 2D field-of-view.

21. The motion tracking system of claim 20, further comprising a second receiver spaced apart from the first receiver and configured to receive emissions from the two or more diodes of the garment within a second 2D field-of-view; and
wherein the processor is further programmed to determine the location of each diode within the second 2D field-of-view.

22. The motion tracking system of claim 21, wherein the processor is further programmed to determine a three-dimensional location of each diode based on the determined positions of each diode in the first and second 2D fields-of-view.

23. A device for eye-tracking, comprising:
a wearable frame configured to be worn on an individual's head; and
a diode according to claim 8 and positioned to direct at least some emissions to the eye; and
a receiver configured to receive emissions from the diode and reflected by the eye; and
a processor in electronic communication with the receiver, the processor being programmed to determine a position of the eye based on the emissions received at the receiver.

24. A method comprising computer-implemented recording of movement of a diode of claim 8.

25. The method of claim 24, wherein the diode is attached to a surface comprising a garment, skin, eyewear, or a medical probe.

* * * * *